(12) United States Patent
Shim

(10) Patent No.: US 12,538,648 B2
(45) Date of Patent: Jan. 27, 2026

(54) TOP EMISSION TYPE ELECTROLUMINESCENCE DISPLAY WITH REDUCED DISTANCE BETWEEN ANODE AND CATHODE

(71) Applicant: LG Display Co., Ltd., Seoul (KR)

(72) Inventor: Sungbin Shim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 635 days.

(21) Appl. No.: 17/959,917

(22) Filed: Oct. 4, 2022

(65) Prior Publication Data

US 2023/0209884 A1 Jun. 29, 2023

(30) Foreign Application Priority Data

Dec. 27, 2021 (KR) .................. 10-2021-0188517

(51) Int. Cl.
| | |
|---|---|
| *H10K 50/86* | (2023.01) |
| *H10D 86/40* | (2025.01) |
| *H10D 86/60* | (2025.01) |
| *H10K 59/121* | (2023.01) |
| *H10K 71/00* | (2023.01) |
| *H10K 59/12* | (2023.01) |
| *H10K 102/00* | (2023.01) |

(52) U.S. Cl.
CPC ......... *H10K 50/865* (2023.02); *H10D 86/481* (2025.01); *H10D 86/60* (2025.01); *H10K 59/1213* (2023.02); *H10K 59/1216* (2023.02); *H10K 71/00* (2023.02); *H10K 59/1201* (2023.02); *H10K 2102/3026* (2023.02)

(58) Field of Classification Search
None
See application file for complete search history.

(56) References Cited

U.S. PATENT DOCUMENTS

| | | | |
|---|---|---|---|
| 2005/0253507 A1 | 11/2005 | Fujimura et al. | |
| 2015/0379923 A1* | 12/2015 | Lee | H10K 59/1315 345/82 |
| 2018/0033849 A1* | 2/2018 | Noh | H10D 86/471 |
| 2019/0207163 A1* | 7/2019 | Paek | H10K 71/135 |
| 2020/0058709 A1* | 2/2020 | Lee | H10K 59/122 |
| 2021/0286210 A1 | 9/2021 | Wakayama | |

FOREIGN PATENT DOCUMENTS

| | | |
|---|---|---|
| JP | 2011-209613 A | 10/2011 |
| KR | 10-2005-0075221 A | 7/2005 |

* cited by examiner

*Primary Examiner* — Sue A Purvis
*Assistant Examiner* — Seyon Ali-Simah Punchbeddell
(74) *Attorney, Agent, or Firm* — Birch, Stewart, Kolasch & Birch, LLP

(57) ABSTRACT

An electroluminescence display can include a pixel on a substrate, and a light emitting element in the pixel. The light emitting element can include a first electrode, an emission layer on the first electrode, and a second electrode on the emission layer. The electroluminescence display can further include a light shield layer under the emission layer with a planarization layer there-between, where the light shield layer overlaps a first portion of the emission layer. A first distance is formed between the first electrode and the second electrode at the first portion of the emission layer. A second distance is formed between the first electrode and the second electrode at a second portion of the emission layer different from the first portion, and the first distance is smaller than the second distance.

9 Claims, 4 Drawing Sheets

TOP EMISSION TYPE ELECTROLUMINESCENCE DISPLAY WITH REDUCED DISTANCE BETWEEN ANODE AND CATHODE

CROSS-REFERENCE TO RELATED APPLICATIONS

This application claims the priority benefit of Patent Application No. 10-2021-0188517 filed in the Republic of Korea on Dec. 27, 2021, the entire contents of which are hereby expressly incorporated by reference into the present application.

BACKGROUND

Field

The present disclosure relates to a top emission type electroluminescence display.

Discussion of the Related Art

Recently, various type of display such as cathode ray tubes (CRTs), liquid crystal displays (LCDs), plasma display panels (PDPs) and electroluminescent displays have been developed. These various types of display are used to display image data of various products such as computer, mobile phones, bank deposit and withdrawal devices (ATMs), and vehicle navigation systems according to their unique characteristics and purposes.

In particular, the electroluminescent display which is a self-luminous display, has an excellent optical performance such as a viewing angle and color realization degree, so that its application field is gradually widening and is receiving attention as an image display device.

Due to these advantages, it is attracting attention as more suitable displays for implementing 4K ultra-high-resolution display and up to 8K ultra-high-resolution display. As the resolution is increased, the size of the pixel becomes smaller and the size of the emission area occupied in the pixel also becomes smaller. As the size of a pixel in the electroluminescence display becomes small, it is preferable to apply a top emission type structure in order to maximize the size ratio of the emission area in the pixel.

As the resolution increases, the size of the pixel can decrease. In order to drive a light emitting element in a smaller pixel, driving power consumption needs to be lowered. However, since it can be difficult to form a narrow distance between the anode electrode and the cathode electrode included in the light emitting diode disposed in the pixel, there is a limitation in lowering the driving power.

Even though the existing manufacturing process is used as it is, it is necessary to develop an electroluminescence display having a new structure capable of reducing the driving power by implementing a narrowed distance between the anode electrode and the cathode electrode.

SUMMARY OF THE DISCLOSURE

One purpose of the present disclosure is to address the problems described above by providing an electroluminescence display having a structure in which driving power consumption is reduced by forming a narrow distance (or gap) between an anode electrode and a cathode electrode.

Another purpose of the present disclosure is to provide an electroluminescence display with a lower overall driving power consumption, after forming the light emitting diode having a distance between the anode electrode and the cathode electrode using an existing manufacturing process, and then applying thermal energy to partially narrow the distance between the anode electrode and the cathode electrode.

According to the present disclosure, in a top emission type electroluminescence display, a portion of a gap between an anode electrode and a cathode electrode can be narrowed by applying thermal energy to a metal layer disposed under a light emitting element.

In order to accomplish at least one of the above mentioned purposes of the present disclosure, an electroluminescence display according to the present disclosure can include a pixel on a substrate; a light emitting element in the pixel and including a first electrode, an emission layer on the first electrode, and a second electrode on the emission layer; and a light shield layer under the emission layer with a planarization layer disposed between the light shield layer and the emission layer, where the light shield layer overlaps a first portion of the emission layer. A first distance is formed between the first electrode and the second electrode at the first portion of the emission layer. A second distance is formed between the first electrode and the second electrode at a second portion of the emission layer different from the first portion, and the first distance is smaller than the second distance.

In one embodiment, the electroluminescence display further comprises a driving element connected to the light emitting element and disposed under the planarization layer, the driving element overlapping the light shield layer with a buffer layer disposed between the driving element and the light shield layer.

In one embodiment, the driving element includes a thin film transistor. The thin film transistor can include a semiconductor layer, a gate electrode overlapping a middle portion of the semiconductor layer, a source electrode connected to one side of the semiconductor layer, and a drain electrode connected to another side of the semiconductor layer. The light shield layer overlaps the semiconductor layer with the buffer layer disposed between the light shield layer and the semiconductor layer.

In one embodiment, the driving element further includes a storage capacitor overlapping the first electrode and connecting to the thin film transistor.

In one embodiment, the light shield layer overlaps the storage capacitor.

In one embodiment, the first portion of the emission layer which the light shield layer overlaps is in a range from 40% to 70% of an entire area of the light emitting element.

In addition, an electroluminescence display according to the present disclosure comprises a pixel on a substrate; a light emitting element in the pixel and including a first electrode, an emission layer on the first electrode and a second electrode on the emission layer; and a light shield layer under the emission layer with a planarization layer there-between and overlapping a portion of the emission layer. A first portion of the emission layer not overlapping the light shield layer has a first thickness. A second portion of the emission layer overlapping the light shield layer has a second thickness thinner than the first thickness.

In one embodiment, the electroluminescence display further comprises a driving element connected to the light emitting element and disposed under the planarization layer, the driving element overlapping the light shield layer with a buffer layer disposed between the driving element and the light shield layer.

In one embodiment, the second portion of the emission layer which the light shield layer overlaps is in a range from 40% to 70% of an entire area of the light emitting element.

Furthermore, a method for manufacturing an electroluminescence display according to the present disclosure comprises forming a light shield layer on a substrate, depositing a buffer layer on an entire surface of the substrate for covering the light shield layer, forming a driving element overlapping a portion of the light shield layer on the buffer layer, depositing a planarization layer on the entire surface of the substrate for covering the driving element, forming a light emitting element overlapping the light shield layer on the planarization layer and including a first electrode, an emission layer and a second electrode, and applying thermal energy to the light shield layer for narrowing a gap between the first electrode and the second electrode where a portion of the emission layer overlapping the light shield layer.

The electroluminescent display according to an embodiment of the present disclosure has a top emission type in which a driving element is disposed on a substrate and a light emitting element is disposed on the driving element. In particular, since the light emitting element is disposed to overlap the driving element, the ratio of the emission area occupied in the pixel area can be maximized.

In addition, metal layers such as a light shielding layer, a data line, a scan line (or a gate line) and a storage capacitor electrode are stacked under the driving element. By applying thermal energy to a portion of the metal layers, a portion of the planarization layer covering the metal layer under the light emitting diode can be inflated. As a result, a part of the anode electrode disposed on the planarization layer can be pushed up by the swelled planarization layer and the distance between the anode electrode and the cathode electrode can become narrow. Accordingly, the driving power of the light emitting diode disposed in the entire pixel area can be reduced.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE EMBODIMENTS

Figure 1:
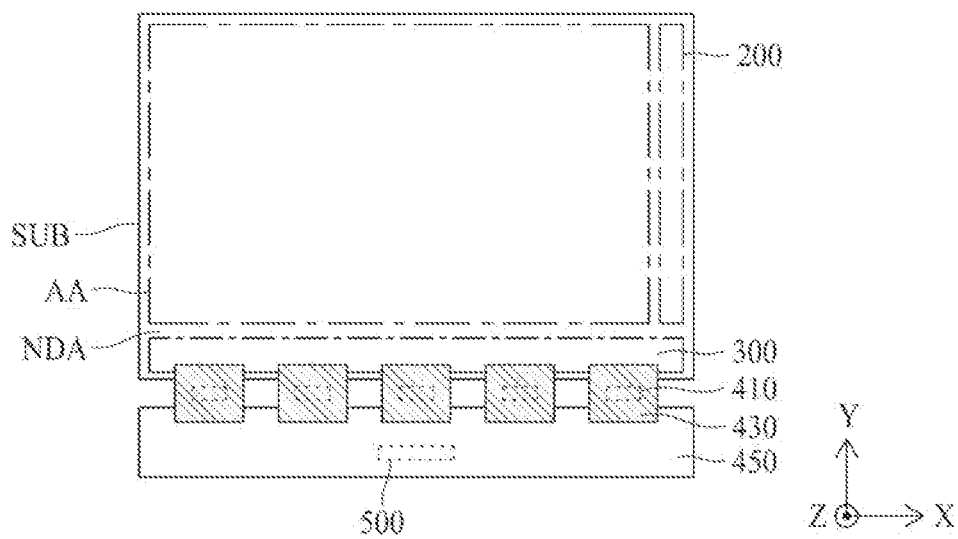
FIG. 1 is a plane view illustrating a schematic structure of an electroluminescence display according to an embodiment of the present disclosure.

Advantages and features of the present disclosure, and implementation methods thereof will be clarified through the following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

Reference will now be made in detail to the exemplary embodiments of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

In the case that "comprise," "have," and "include" described in the present specification are used, another part can also be present unless "only" is used. The terms in a singular form can include plural forms unless noted to the contrary.

In construing an element, the element is construed as including an error range although there is no explicit description.

In describing a positional relationship, for example, when the positional order is described as "on," "above," "below," and "next," the case of no contact there-between can be included, unless "just" or "direct" is used. If it is mentioned that a first element is positioned "on" a second element, it does not mean that the first element is essentially positioned above the second element in the figure. The upper part and the lower part of an object concerned can be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous can be included, unless "just" or "direct" is used.

It will be understood that, although the terms "first," "second," etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as the first, the second, A, B, (a) and (b) can be used.

These terms are only to distinguish the elements from one another, and the terms do not limit nature, order, sequence or number of the elements. When an element is described as being "linked", "coupled" or "connected" to another element, that element can be directly or indirectly connected to the other element, unless otherwise specified. It is to be understood that other elements can be "interposed" between each element that can be connected to or coupled to.

It should be understood that the term "at least one" includes all combinations related with any one item. For example, "at least one among a first element, a second element and a third element" can include all combinations of two or more elements selected from the first, second and third elements as well as each element of the first, second and third elements.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in a co-dependent relationship.

Hereinafter, an example of a display apparatus according to the present disclosure will be described in detail with reference to the accompanying drawings. In designating reference numerals to elements of each drawing, the same components can have the same reference numerals as much as possible even though they are shown in different drawings. Scale of the elements shown in the accompanying drawings have a different scale from the actual for convenience of description, it is not limited to the scale shown in the drawings.

Hereinafter, referring to attached figures, various embodiments of the present disclosure will be explained below in detail. Further, all the components of each display according to all embodiments of the present disclosure are operatively coupled and configured.

FIG. 1 is a diagram illustrating a schematic structure of an electroluminescence display according to the present disclosure. In FIG. 1, X-axis can be parallel to the extending direction of the scan line, Y-axis can be parallel to the extending direction of the data line, and Z-axis can represent the thickness direction of the display.

Referring to FIG. 1, the electroluminescence display comprises a substrate SUB, a gate (or scan) driver 200, a data pad portion 300, a source driving IC (Integrated Circuit) 410, a flexible film 430, a circuit board 450, and a timing controller 500.

The substrate SUB can include an electrical insulating material or a flexible material. The substrate SUB can be made of a glass, a metal or a plastic, but it is not limited thereto. When the electroluminescence display is a flexible display, the substrate SUB can be made of the flexible material such as plastic. For example, the substrate SUB can include a transparent polyimide material.

The substrate SUB can include a display area AA and a non-display area NDA. The display area AA, which is an area for representing the video images, can be defined as the majority middle area of the substrate SUB, but it is not limited thereto. In the display area AA, a plurality of scan lines (or gate lines), a plurality of data lines and a plurality of pixels can be formed or disposed. Each of pixels can include a plurality of sub pixels. Each of the sub pixels includes the scan line and the data line, respectively.

The non-display area NDA, which is an area not representing the video images, can be defined at the circumference areas of the substrate SUB surrounding all or some of the display area AA. In the non-display area NDA, the gate driver 200 and the data pad portion 300 can be formed or disposed.

The gate driver 200 can supply the scan (or gate) signals to the scan lines according to the gate control signal received from the timing controller 500. The gate driver 200 can be formed at the non-display area NDA at any one outside of the display area AA on the substrate SUB, as a GIP (Gate driver In Panel) type. GIP type means that the gate driver 200 is directly formed on the substrate SUB.

The data pad portion 300 can supply the data signals to the data line according to the data control signal received from the timing controller 500. The data pad portion 300 can be made as a driver chip and mounted on the flexible film 430. Further, the flexible film 430 can be attached at the non-display area NDA at any one outside of the display area AA on the substrate SUB, as a TAB (Tape Automated Bonding) type.

The source driving IC 410 can receive the digital video data and the source control signal from the timing controller 500. The source driving IC 410 can convert the digital video data into the analog data voltages according to the source control signal and then supply that to the data lines. When the source driving IC 410 is made as a chip type, it can be installed on the flexible film 430 as a COF (Chip On Film) or COP (Chip On Plastic) type.

The flexible film 430 can include a plurality of first link lines connecting the data pad portion 300 to the source driving IC 410, and a plurality of second link lines connecting the data pad portion 300 to the circuit board 450. The flexible film 430 can be attached on the data pad portion 300 using an anisotropic conducting film, so that the data pad portion 300 can be connected to the first link lines of the flexible film 430.

The circuit board 450 can be attached to the flexible film 430. The circuit board 450 can include a plurality of circuits implemented as the driving chips. For example, the circuit board 450 can be a printed circuit board or a flexible printed circuit board.

The timing controller 500 can receive the digital video data and the timing signal from an external system board through the line cables of the circuit board 450. The timing controller 500 can generate a gate control signal for controlling the operation timing of the gate driver 200 and a source control signal for controlling the source driving IC 410, based on the timing signal. The timing controller 500 can supply the gate control signal to the gate driver 200 and supply the source control signal to the source driving IC 410. Depending on the product types, the timing controller 500 can be formed as one chip with the source driving IC 410 and mounted on the substrate SUB.

Figure 2:
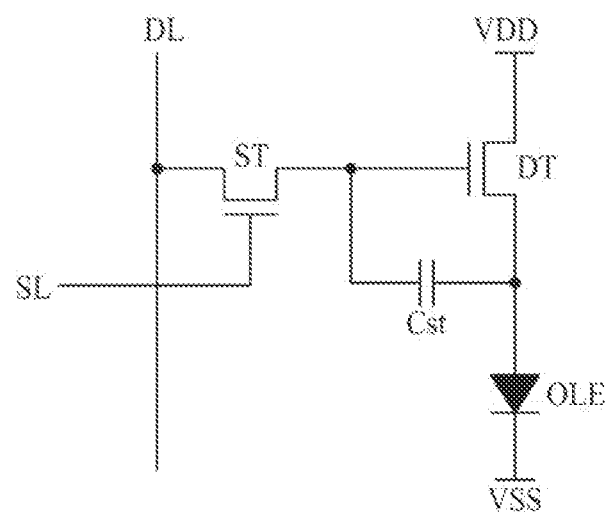
FIG. 2 is a circuit diagram illustrating a structure of one pixel according to an embodiment of the present disclosure.
Figure 3:
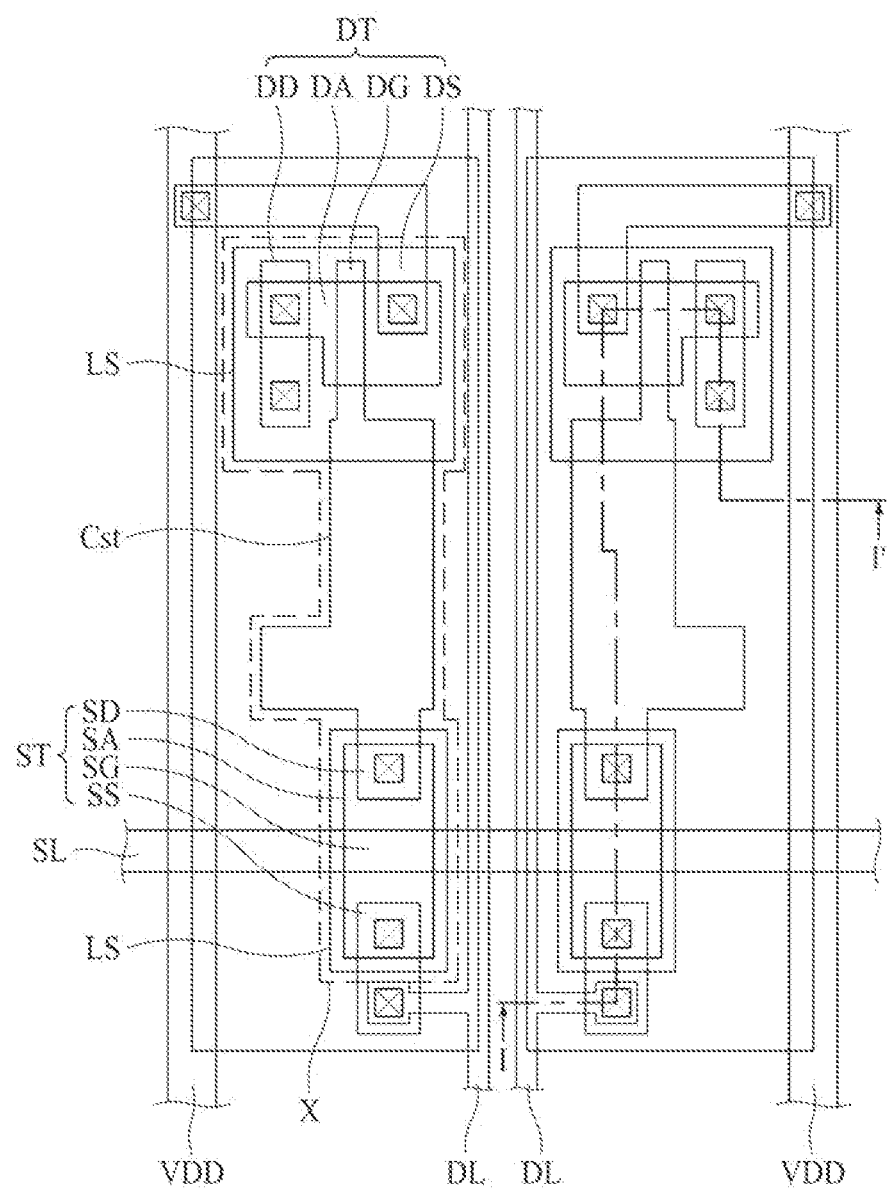
FIG. 3 is an enlarged plan view illustrating a structure of the pixels disposed in the electroluminescence display according to an embodiment of the present disclosure.
Figure 4:
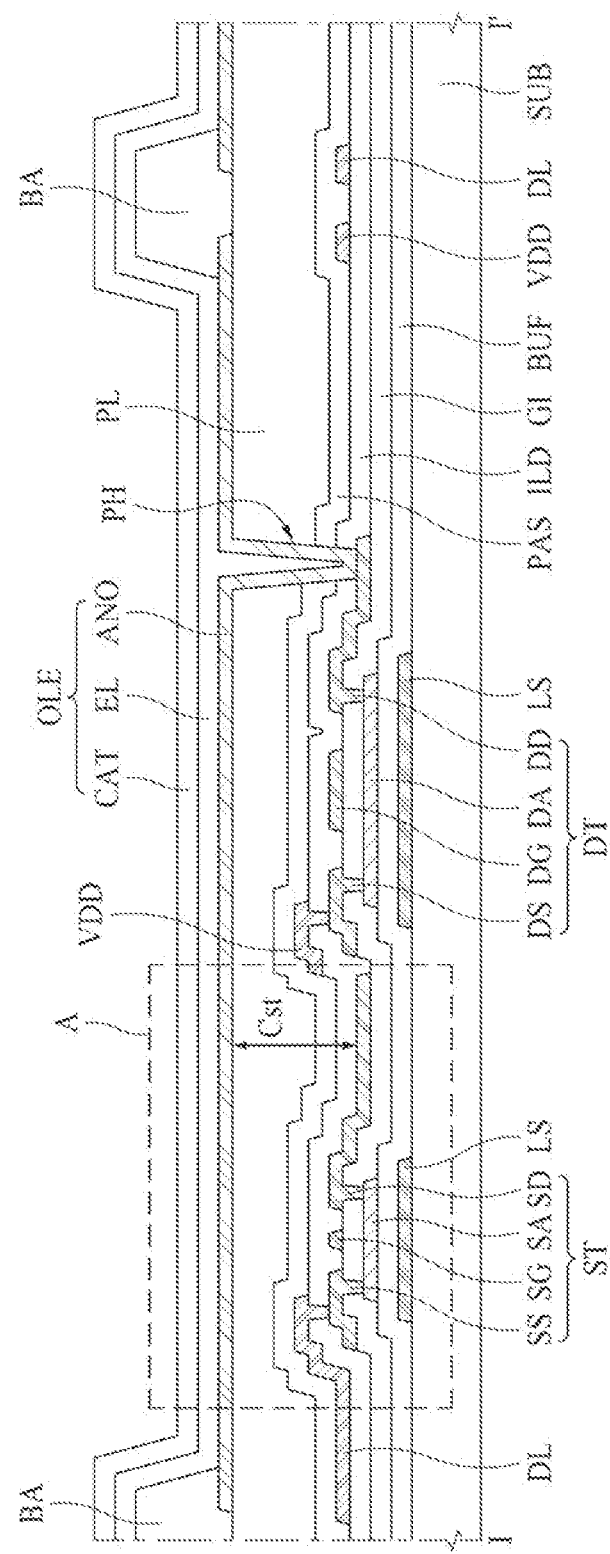
FIG. 4 is a cross-sectional view cut along line I-I' in FIG. 3, for illustrating the structure of the electroluminescence display according to an embodiment of the present disclosure.

FIG. 1 is a plane view illustrating a schematic structure of an electroluminescence display according to the present disclosure. FIG. 2 is a circuit diagram illustrating a structure of one pixel according to the present disclosure. FIG. 3 is an enlarged plan view illustrating a structure of the pixels disposed in the electroluminescence display according to the present disclosure. FIG. 4 is a cross-sectional view cut along line I-I' in FIG. 3, for illustrating the structure of the electroluminescence display according to the present disclosure.

Referring to FIG. 2 to 4, one-pixel (or each pixel) of the light emitting display can include a scan line SL, a data line DL and a driving current line VDD. One pixel of the light emitting display can include a switching thin film transistor ST, a driving thin film transistor DT, a light emitting diode OLE and a storage capacitor Cst. The driving current line VDD can be supplied with a high-level voltage for driving the light emitting diode OLE.

For example, the switching thin film transistor ST can be disposed at the portion where the scan line SL and the data line DL is crossing. The switching thin film transistor ST can include a switching gate electrode SG, a switching semiconductor layer SA, a switching source electrode SS and a switching drain electrode SD. The switching gate electrode SG can be branched from the scan line SL, or it can be defined as a portion of the scan line SL, as shown in FIG. 3. The switching source electrode SS can be connected to the data line DL and the switching drain electrode SD can be connected to the driving thin film transistor DT. The switching semiconductor layer SA overlaps the switching gate electrode SG. One end of the switching semiconductor layer SA connects to the switching source electrode SS and another end of the switching semiconductor layer SA connects to the switching drain electrode SD. By supplying the data signal to the driving thin film transistor DT, the switching thin film transistor ST can play a role of selecting a pixel which would be driven.

The driving thin film transistor DT can play a role of driving the light diode OLE of the selected pixel by the switching thin film transistor ST. The driving thin film transistor DT can include a driving gate electrode DG, a driving semiconductor layer DA, a driving source electrode DS and a driving drain electrode DD. The driving gate electrode DG can be connected to the switching drain electrode SD of the switching thin film transistor ST. The driving source electrode DS can be connected to the driving current line VSS, and the driving drain electrode DD can be connected to an anode electrode ANO of the light emitting diode OLE. The driving semiconductor layer DA overlaps the driving gate electrode DG. One end of the driving semiconductor layer DA connects to the driving source electrode DS and another end of the driving semiconductor layer DA connects to the driving drain electrode DD. A storage capacitor Cst can be disposed between the driving drain electrode DD of the driving thin film transistor DT and the anode electrode ANO of the light emitting diode OLE.

The driving thin film transistor DT can be disposed between the driving current line VDD and the light emitting diode OLE. The driving thin film transistor DT can control the amount of electric currents flowing to the light emitting diode OLE from the driving current line VDD according to the voltage level of the driving gate electrode DG connected to the switching drain electrode SD of the switching thin film transistor ST.

FIG. 4 shows the thin film transistors ST and DT having the top gate structure. The top gate structure preferably means that the gate electrodes SG and DG are disposed on the semiconductor layers SA and DA, respectively. In detail, the top gate structure can have the semiconductor layers SA and DA first formed on the substrate SUB, and the gate electrodes SG and DG formed on the gate insulating layer GI covering the semiconductor layers SA and DA. For another example, the electroluminescence display according to the present disclosure can have a bottom gate structure.

The bottom gate structure can have the gate electrodes SG and DG first formed on the substrate SUB, and the semiconductor layers SA and DA on the gate insulating layer GI covering the gate electrodes SG and DG. It is preferable that the electroluminescence display according to the present disclosure, in implementing ultra-high resolution density, can include a thin film transistor having a top gate structure in order to increase the aperture ratio, which is the ratio of the emission area to the pixel area.

In addition, according to the top gate structure shown in FIG. 4, the switching source electrode SS, the switching drain electrode SD, the driving source electrode DS and the driving drain electrode DD are formed on the same layer with the gate electrodes SG and DG. In other word, the source electrodes SS and DS and the drain electrodes SD and DD can be formed on the same layer with the layer on which the scan line SL and the gate electrodes SG and DG are formed, but the data line DL and the driving current line VDD can be formed on the different layer from the scan line SL. The intermediate insulating layer ILD can be stacked on the gate electrodes SG and DG, the source electrodes SS and DS and the drain electrodes SD and DD. The data line DL and the driving current line VDD can be disposed on the intermediate insulating layer ILD.

The light emitting diode OLE can include an anode electrode ANO, an emission layer EL and a cathode electrode CAT. The light emitting diode OLE can emit the light according to the amount of the electric current controlled by the driving thin film transistor DT. In other word, the light emitting diode OLE can be driven by the voltage differences between the low-level voltage and the high-level voltage controlled by driving thin film transistor DT, thereby the luminance of the electroluminescence display can be controlled. The anode electrode ANO of the light emitting diode OLE can be connected to the driving drain electrode DD of the driving thin film transistor DT, and the cathode electrode CAT can be connected to the low-level power line VSS supplying the low-level electric voltage. The light emitting diode OLE can be driven by the voltage difference between the high-level electric voltage controlled by the driving thin film transistor DT and the low-level electric voltage.

The passivation layer PAS can be deposited on the substrate SUB having the thin film transistors ST and DT. It is preferable that the passivation layer PAS can be made of the organic material such as silicon oxide (SiOx) or silicon nitride (SiNx). The planarization layer PL can be deposited on the passivation layer PAS. The planarization layer PL can be a film layer for flattening the non-uniform surface of the substrate SUB on which the thin film transistors ST and DT are formed. In order to make the height difference uniform, the planarization layer PL can be formed of an organic material. The passivation layer PAS and the planarization layer PL can have a pixel contact hole PH exposing a part of the driving drain electrode DD of the driving thin film transistor DT.

The anode electrode ANO can be formed on the upper surface of the planarization layer PL covering the thin film transistors ST and DT. The anode electrode ANO can be connected to the driving drain electrode DD of the driving thin film transistor DT through the pixel contact hole PH. The anode electrode ANO can have different structure according to the emission structure of the light emitting diode OLE. For an example of the bottom emission type in which lights generated from the emission layer emit to the direction at which the substrate SUB is disposed, the anode electrode ANO can include a transparent conductive material. For another example of the top emission type in which lights generated from the emission layer emit to the opposite direction to the substrate SUB, the anode electrode ANO can be made of metal material having excellent light reflectance. For example, the anode electrode can include any one of silver (Ag), aluminum (Al), molybdenum (Mo), gold (Au), magnesium (Mg), calcium (Ca) and barium (Ba), or alloy of them. Otherwise, the anode electrode ANO of the top emission type can include a metal layer having excellent light reflectance and a transparent conductive material layer on the metal layer.

In the present disclosure, it is preferable to have the top emission type suitable for realization of ultra-high resolution. In the top emission type, it is preferable that the anode electrode ANO has a maximum area in a pixel area defined by the data line DL, the driving current line VDD and the scan line SL. In this case, the thin film transistors ST and DT can be disposed to overlap with the anode electrode ANO under the anode electrode ANO. In addition, the data line DL, the driving current line VDD and the scan line SL can also partially overlap the anode electrode ANO.

A bank BA is formed on the anode electrode ANO. The bank BA can cover the circumference areas of the anode electrode ANO, and expose most of middle portions of the anode electrode ANO. The exposed area of the anode electrode ANO by the bank BA can be defined as an emission area of the pixel.

In the top emission type, the thin film transistors ST and DT can be disposed as overlapped the emission area. In addition, some portions of the data line DL, the driving current line VDD and the scan line SL can be disposed as overlapped the emission area.

An emission layer EL is deposited on the anode electrode ANO and the bank BA. The emission layer EL can be deposited on the whole of the display area AA as covering the anode electrode ANO and the bank BA. For an embodiment, the emission layer EL can include two or more emission layers which are vertically stacked for combining different color lights and emitting white light. For example, the emission layer EL can include a first emission layer and a second emission layer for combining a first color light and a second color light to emit white light.

For another embodiment, the emission layer EL can include any one of blue emission layer, green emission layer and red emission layer for providing color light allocated at the pixel. In this case, the emission layer EL can be disposed as being isolated within each emission area defined by the bank BA. In addition, the light emitting diode OLE can further include functional layers for enhancing the emission efficiency and/or the light time of the emission layer EL.

A cathode electrode CAT is deposited on the emission layer EL as being in surface-contact with the emission layer EL. The cathode electrode CAT is deposited as covering whole surface of the substrate SUB as being in connected with the emission layer EL disposed at all pixels. For the top emission type, it is preferable that the cathode electrode CAT can be made of transparent conductive material such as indium-tin-oxide (ITO) or indium-zinc-oxide (IZO).

After completing the light emitting diode OLE by depositing the cathode electrode CAT, an encapsulation layer can be disposed on the cathode electrode CAT. The encapsulation layer can have a structure in which an inorganic layer, an organic layer and an inorganic layer can be sequentially stacked. In addition, color filters can be formed on the encapsulation layer. The color filter can be formed as having a size same or little larger than the anode electrode ANO and being fully overlapped with the anode electrode ANO.

The electroluminescence display according to the present disclosure can further include a light shield layer LS. The light shield layer LS can be disposed under the semiconductor layers SA and DA to prevent light from intruding into the semiconductor layers SA and DA from changing the channel characteristics of the semiconductor channel region. For example, the light shield layer LS can be first formed on the substrate SUB. For example, after the light shield layer LS is formed at positions where the semiconductor layers SA and DA are to be disposed on the substrate SUB, the buffer layer BUF can be deposited on the entire surface of the substrate SUB.

In addition to preventing external light from penetrating into the semiconductor layers SA and DA, the light shield layer LS can be used as a repair element to connect a defective pixel to a neighboring normal pixel for restoring the defective pixel normally. Otherwise, the light shield layer LS can be used as the data line DL or the driving current line VDD. For another example, the light shield layer LS can be used as a second gate electrode for implementing a thin film transistor having the double gate structure.

After completing the electroluminescence display having a structure shown in FIG. 4, a LASER can be irradiated from the under direction of the substrate SUB for applying thermal energy to the metal layers such as the light shield layer LS and the electrode of the storage capacitor Cst. As a result, the planarization layer PL including the organic material stacked on the metal layers can swell upward by thermal energy applied to the light shield layer LS and the electrode of the storage capacitor Cst.

Figure 5:
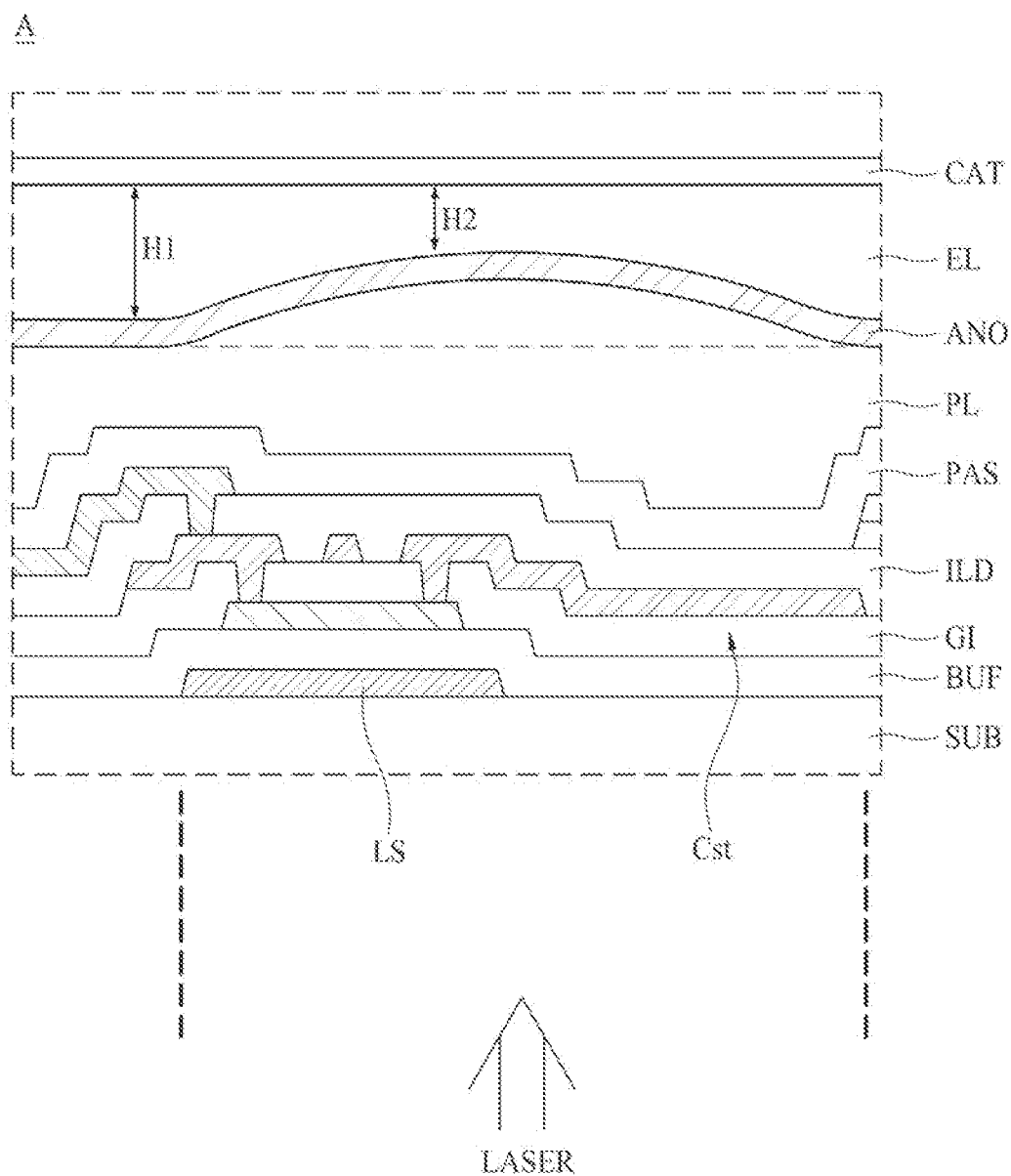
FIG. 5 is a cross-sectional view enlarging a dotted box portion 'A' in FIG. 4, for illustrating a structure of a light emitting diode by a heat treatment process using a LASER in an electroluminescence display according to an embodiment of the present disclosure.

Accordingly, as shown in FIG. 5, a part of the anode electrode ANO can swell up toward the cathode electrode CAT. FIG. 5 is a cross-sectional view enlarging a dotted box portion 'A' in FIG. 4, for illustrating a structure of a light emitting diode by a heat treatment process using a LASER in an electroluminescence display according to the present disclosure. In other word, before irradiating the LASER, the gap between the anode electrode ANO and the cathode electrode CAT can have a first height H1, but after irradiating the LASER, the gap between the anode electrode ANO and the cathode electrode CAT can have a second height H2 that is smaller than the first height H1.

The power consumption can be determined by the distance (or gap) between the anode electrode ANO and the cathode electrode CAT in the light emitting diode OLE, for example, the thickness of the emission layer EL. For example, as thickness of the emission layer EL increases, the electrical potential difference between the anode electrode ANO and the cathode electrode CAT applied to generate light from the emission layer EL can be increased. In other word, there can be a positive proportional relationship between the thickness of the emission layer EL and the driving power. Accordingly, thinning the thickness of the emission layer EL can be a primary factor for reducing the power consumption.

However, the process of manufacturing an electroluminescence display includes the processes of setting a predetermined thickness, and stacking thin films suitable for the thickness, in consideration of the materials used, the manufacturing conditions and the functional characteristics of each layer to be formed. Therefore, arbitrarily changing the thickness of one thin layer is not easy to determine because it can affect the overall processes. For example, the emission layer EL of the light emitting diode OLE can be formed by considering all conditions such as light emitting efficiency, light emitting material and driving method, in a mass-production condition. Under this situation, it can be hard to easily change the manufacturing process because it can be hard to predict how arbitrarily reducing the thickness of the emission layer EL will affect the quality of the entire display device.

In the present disclosure, after manufacturing the electroluminescence display by the existing manufacturing process determined in consideration of various process conditions and performance, a local heat treatment process, as a post-process, using a LASER is used to manufacture the light emitting diode OLE in which a distance between the anode electrode ANO and the cathode electrode CAT can be formed to be narrower in some areas. As a result, the driving voltage for driving the light emitting diode OLE in the entire pixel area can be set much lower than that of the conventional art.

In FIG. 3, a portion X indicated by a dotted line is a portion occupied by the light shield layer LS and the storage capacitor Cst. The light shield layer LS can be formed to have a large area under the storage capacitor Cst to completely overlap the storage capacitor Cst. In any case, the ratio of the area occupied by the light shield layer LS or the area occupied by the light shield layer LS and the storage capacitor Cst to the area of the pixel area in a plan view can be at least 40% to 70%. When LASER heat treatment is applied, a gap between the anode electrode ANO and the cathode electrode CAT can be formed narrowly in an area of 40% to 70% of pixel area. Accordingly, it is possible to obtain the effect of reducing the driving power consumption by 40% to 70%.

When the light shield layer LS is used as a repair line and a LASER in a wavelength band of 266 nm used in the repair process is applied, the heat treatment process can be performed together in the repair process without a separated heat treatment process. In this case, an advantage of preventing an increase in the manufacturing tack time can also be obtained.

The repair process performs a process of disconnecting a connection portion, or melting two overlapped electrodes (or lines) with an insulating layer there-between to connect them. On the other hand, the heat treatment for narrowing the distance between the anode electrode ANO and the cathode electrode CAT may not require high energy to cut or melt the component. Therefore, when the heat treatment process is performed using the repair process, it is preferable to reduce the time for irradiating the LASER compared to repair process so as not to damage the light emitting diode.

Meanwhile, in the case of using a heat treatment process using a different LASER from that of the repair process, it is preferable to adjust the intensity of the LASER used so as not to damage other components disposed in the pixel area, or to adjust the LASER irradiation time.

The features, structures, effects and so on described in the above examples of the present disclosure are included in at least one example of the present disclosure, and are not limited to only one example. Furthermore, the features, structures, effects and the likes explained in at least one example can be implemented in combination or modification with respect to other examples by those skilled in the art to which this disclosure belongs. Accordingly, contents related to such combinations and variations should be construed as being included in the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An electroluminescence display comprising:
   a pixel on a substrate;
   a light emitting element in the pixel, the light emitting element including a first electrode, an emission layer on the first electrode, and a second electrode on the emission layer; and
   a light shield layer under the emission layer with a planarization layer disposed between the light shield layer and the emission layer, the light shield layer overlapping a first portion of the emission layer,
   wherein a first distance is formed between the first electrode and the second electrode at the first portion of the emission layer,
   wherein a second distance is formed between the first electrode and the second electrode at a second portion of the emission layer different from the first portion, the first distance being smaller than the second distance, and
   wherein the first portion of the emission layer which the light shield layer overlaps is in a range from 40% to 70% of an entire area of the light emitting element.

2. The electroluminescence display according to claim 1, further comprising:
   a driving element connected to the light emitting element and disposed under the planarization layer, the driving element overlapping the light shield layer with a buffer layer disposed between the driving element and the light shield layer.

3. The electroluminescence display according to claim 2, wherein the driving element includes a thin film transistor having:
   a semiconductor layer;
   a gate electrode overlapping a middle portion of the semiconductor layer;
   a source electrode connected to one side of the semiconductor layer; and
   a drain electrode connected to another side of the semiconductor layer,
   wherein the light shield layer overlaps the semiconductor layer with the buffer layer disposed between the light shield layer and the semiconductor layer.

4. The electroluminescence display according to claim 3, wherein the driving element further includes:
   a storage capacitor overlapping the first electrode and connecting to the thin film transistor.

5. The electroluminescence display according to claim 4, wherein the light shield layer overlaps the storage capacitor.

6. An electroluminescence display comprising:
   a pixel on a substrate;
   a light emitting element in the pixel, the light emitting element including a first electrode, an emission layer on the first electrode and a second electrode on the emission layer; and
   a light shield layer under the emission layer with a planarization layer there-between, the light shield layer overlapping a portion of the emission layer,
   wherein a first portion of the emission layer not overlapping the light shield layer has a first thickness,
   wherein a second portion of the emission layer overlapping the light shield layer has a second thickness thinner than the first thickness, and wherein the second portion of the emission layer which the light shield layer overlaps is in a range from about 40% to 70% of an entire area of the light emitting element.

7. The electroluminescence display according to claim 6, further comprising:
a driving element connected to the light emitting element and disposed under the planarization layer, the driving element overlapping the light shield layer with a buffer layer disposed between the driving element and the light shield layer.

8. A method for manufacturing an electroluminescence display, the method comprising:
forming a light shield layer on a substrate;
depositing a buffer layer on an entire surface of the substrate for covering the light shield layer;
forming a driving element overlapping a portion of the light shield layer on the buffer layer;
depositing a planarization layer on the entire surface of the substrate for covering the driving element;
forming a light emitting element overlapping the light shield layer on the planarization layer, the light emitting element including a first electrode, an emission layer and a second electrode; and
applying thermal energy to the light shield layer for narrowing a gap between the first electrode and the second electrode where a portion of the emission layer overlaps the light shield layer.

9. An electroluminescence display comprising:
a plurality of pixels on a substrate, each pixel including a light emitting element, wherein the light emitting element comprises a first electrode, an emission layer on the first electrode, and a second electrode on the emission layer; and
a light shield layer under the light emitting element of each pixel,
wherein the light shield layer is applied with thermal energy, so that a part of the first electrode above the light shield layer swells up toward the second electrode and a thickness of a part of the emission layer between the swelled part of the first electrode and the second electrode is reduced, and
wherein a portion of the light emitting element of each pixel which the light shield layer overlaps is in a range from about 40% to 70% of an entire area of the light emitting element.

* * * * *